(12) United States Patent
Koike et al.

(10) Patent No.: US 7,019,405 B2
(45) Date of Patent: Mar. 28, 2006

(54) TERMINAL, SEMICONDUCTOR DEVICE, TERMINAL FORMING METHOD AND FLIP CHIP SEMICONDUCTOR DEVICE MANUFACTURING METHOD

(75) Inventors: Hiroko Koike, Nagano (JP); Mitsutoshi Higashi, Nagano (JP); Hideaki Sakaguchi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/430,652

(22) Filed: May 6, 2003

(65) Prior Publication Data

US 2003/0222326 A1 Dec. 4, 2003

(30) Foreign Application Priority Data

Jun. 3, 2002 (JP) .............................. 2002-161840

(51) Int. Cl.
*H01L 23/48* (2006.01)
*H01L 23/52* (2006.01)
*H01L 29/40* (2006.01)

(52) U.S. Cl. ....................... 257/778; 257/737

(58) Field of Classification Search ................. 257/737, 257/778

See application file for complete search history.

(56) References Cited

U.S. PATENT DOCUMENTS

| 6,476,502 B1 * | 11/2002 | Yamada et al. ............. 257/778 |
| 6,525,408 B1 * | 2/2003 | Akram et al. ............... 257/668 |
| 2003/0122253 A1 * | 7/2003 | Hsu ........................... 257/738 |
| 2003/0127734 A1 * | 7/2003 | Lee et al. .................... 257/737 |

FOREIGN PATENT DOCUMENTS

| JP | 08-162491 | 6/1996 |
| JP | 08-264540 | 10/1996 |
| JP | 09-167771 | 6/1997 |

* cited by examiner

*Primary Examiner*—Jerome Jackson
*Assistant Examiner*—Jesse A. Fenty
(74) *Attorney, Agent, or Firm*—Ladas & Parry LLP

(57) ABSTRACT

In a terminal, a semiconductor device, a terminal forming method and a flip chip semiconductor device manufacturing method, it is possible to lessen damage to a semiconductor element due to vibration caused by an ultrasonic wave and settle misalignment and height unevenness of terminals. The terminal includes a pad provided on an active surface of an electric element having an IC chip, a metal post connected to the pad, and a projection electrode provided on the metal post.

6 Claims, 6 Drawing Sheets

PRIOR ART

TERMINAL, SEMICONDUCTOR DEVICE, TERMINAL FORMING METHOD AND FLIP CHIP SEMICONDUCTOR DEVICE MANUFACTURING METHOD

BACKGROUND OF THE INVENTION

1. Field of the Invention

The present invention generally relates to a terminal, a semiconductor device, a terminal forming method and a flip chip semiconductor device manufacturing method, and more particularly to a terminal having a metal post, a semiconductor device, a terminal forming method and a flip chip semiconductor device manufacturing method.

2. Description of the Related Art

Recently, increasing density of semiconductor devices has promoted the development of technologies for reducing the size and the thickness of the semiconductor devices. Among the technologies, a flip chip bonding method is known as one of flip chip mounting methods for directly mounting a bare chip on a substrate.

A description will now be given, with reference to FIGS. 1A through 1C, of an outline of a conventional flip chip bonding method. In the flip chip bonding method, electrodes (pads) $2_1$ through $2_5$ are provided on an active surface of an electric element 3 such as an IC (Integrated Circuit) chip, CSP (Chip Size Package) and a SAW (Surface Acoustic Wave) filter as shown in FIG. 1A. Then, bumps 11 through 15 are formed as projection electrodes on the electrodes $2_1$ through $2_5$. As is shown in FIG. 1B, the electrodes $2_1$ through $2_5$ on the electric element 3 are aligned with electrodes $4_1$ and $4_5$ on a substrate 5 formed of ceramics or the like. After that, as is shown in FIG. 1C, the electrodes $2_1$ through $2_5$ on the electric element 3 are mounted to the electrodes $4_1$ and $4_5$ on the substrate 5 via bumps 6 by adding heat, pressure or the like. Here, the cylindrical bumps 6 are formed through surface tension between the electrodes $2_1$ through $2_5$ on the electric substrate 3 and the electrodes $4_1$ and $4_5$ on the substrate 5 by melting the spherical bumps 1. The bumps 6 may be formed as fillet-shaped bumps or barrel-shaped bumps instead of the cylindrical bumps.

There are some bump forming methods such as a plating method, a deposition method, a transfer method and a wire bonding method. In the wire bonding method, a bump, which is called a bonding bump, is formed by using a capillary of a wire bonding apparatus. Among these bump forming methods, the plating method and the wire bonding method are widely used because the deposition method and the transfer method include many processes and require large amounts of capital investment.

A description will now be given, with reference to FIG. 2, of a bonding bump formed according to the conventional bonding bump method. In FIG. 2, a bonding bump is provided on an electrode 12 on an electric element 11 and is formed of metal materials such as gold, copper and solder. The bonding bump comprises a bump part 13 and a neck part 14. For instance, the total height of the bump part 13 and the neck part 14 is about 50 µm through 60 µm.

A description will now be given, with reference to FIGS. 3A through 3D, of the conventional bonding bump forming method. In FIGS. 3A through 3D, a capillary 22 is often used in ordinary wire bonding methods. A wire 21 is extruded every predetermined length from the interior of the capillary 22. A ball 23 is formed at an end of the wire 21. An electrode 24 is provided on an electric element 25. A bump 26 is formed on the electrode 24.

The bump 26 is formed according to the following steps. First, as is shown in FIG. 3A, the ball 23 is formed at the end of the wire 21 by adding heat or providing a spark. Then, as is shown in FIG. 3B, the capillary 22 depresses and bonds the ball 23 on the electrode 24 in thermocompression by using an ultrasonic wave. As is shown in FIGS. 3C and 3D, when the capillary 22 is pulled up and the wire 21 is cut off, the bump 26 is formed on the surface of the electric element 25. If the above-mentioned steps are iterated, a large number of the bumps 26 can be formed on the surface of the electric element 25.

In the flip chip mounting, if a child chip is already mounted to the semiconductor device, it is necessary to provide a bump of appropriate height for successful implementation of the flip chip mounting without harmful influence on the chip.

In order to form such a bump of appropriate height, Japanese Laid-Open Patent Applications No. 08-162491, No. 08-264540 and No. 09-167771 disclose bump forming methods for forming a two-layer bump. In the bump forming methods according to Japanese Laid-Open Patent Applications No. 08-162491 and No. 08-264540, both layers of the two-layer bump are formed as bonding bumps. On the other hand, in the bump forming method according to Japanese Laid-Open Patent Application No. 09-167771, the two-layer bump has a plating bump in the lower layer and a bonding bump in the upper layer.

It is noted that the bump forming method according to Japanese Laid-Open Patent Application No. 09-167771 further can form more than two layers of a bonding bump so as to attain appropriate height.

In the disclosed conventional bump forming methods, however, a bonding bump method is used to form such a bump.

According to Japanese Laid-Open Patent Applications No. 08-162491 and No. 08-264540, since an ultrasonic wave is used in the conventional bonding bump method, the bump forming methods have a problem in that the ultrasonic wave is provided to an electrode two consecutive times so as to form a two-layer bump and an electrode under the formed two-layer bump is badly damaged due to the radiated ultrasonic wave.

Also, according to Japanese Laid-Open Patent Application No. 09-167771, although a multi-layer bonding bump of appropriate height can be formed, it is difficult to accurately superpose individual layers at the center of the bump. In general, the superposed layers are misaligned with respect to the center of the bump. In this case, it is impossible to obtain a proper flip chip connection due to connection misalignment.

Furthermore, it is difficult to control the height of a bonding bump in multi-layer bonding bump formation. As a result, it is impossible to form bonding bumps of uniform height, and there arises a difference between a high bonding bump and a low bonding bump. In this case, it is impossible to obtain a proper flip chip connection at the low bonding bump.

SUMMARY OF THE INVENTION

It is a general object of the present invention to provide a terminal, a semiconductor device, a terminal forming method and a flip chip semiconductor device manufacturing method in which the above-mentioned problems are eliminated.

A more specific object of the present invention is to provide a terminal, a semiconductor device, a terminal forming method and a flip chip semiconductor device manufacturing method that can lessen damage to a semiconductor element due to vibration caused by an ultrasonic wave and improve misalignment and height unevenness of individual terminals.

In order to achieve the above-mentioned objects, there is provided according to one aspect of the present invention a terminal, comprising: a pad being provided on an active surface of an electric element; a metal post being connected to the pad; and a projection electrode being provided on the metal post.

According to the above-mentioned invention, since the terminal contains a pad provided on an active surface of an electric element, a metal post connected to the pad, and a projection electrode provided on the metal post, it is possible to lessen damage to the electric element due to vibration caused by an ultrasonic wave and suppress misalignment and height unevenness of individual terminals.

In the above-mentioned terminal, the projection electrode may be primarily formed of gold, and one of gold, nickel and a gold coating may be provided on a surface of the metal post where the metal post is in contact with the projection electrode.

According to the above-mentioned invention, when the bonding bump is primarily formed of gold, it is possible to achieve highly reliable connections between the electric element and the substrate.

In the above-mentioned terminal, the metal post may be formed of copper.

According to the above-mentioned invention, when the metal post is formed of copper, it is possible to obtain a less connection-resistant terminal that has high heat radiation effect.

In the above-mentioned terminal, the projection electrode may be a bonding bump.

According to the above-mentioned invention, when an electric element is connected to the substrate, the bonding bump serves as a cushion. As a result, it is possible to lessen damage to the electric element due to the flip chip connection.

Additionally, there is provided according to another aspect of the present invention a terminal, comprising: a pad being provided on a substrate; a metal post being connected to the pad; and a projection electrode being provided on the metal post.

According to the above-mentioned invention, when an electric element is flip chip bonded, it is possible to lessen damage to the electric element due to vibration caused by an ultrasonic wave and suppress misalignment and height unevenness of individual terminals.

In the above-mentioned terminal, the projection electrode may be primarily formed of gold and one of gold, nickel and a gold coating may be provided on a surface of the metal post where the metal post is in contact with the projection electrode.

According to the above-mentioned invention, when the bonding bump is primarily formed of gold, it is possible to achieve highly reliable connections between the electric element and the substrate.

In the above-mentioned terminal, the metal post may be formed of copper.

According to the above-mentioned invention, when the metal post is formed of copper, it is possible to obtain a less connection-resistant terminal that has high heat radiation effect.

In the above-mentioned terminal, the projection electrode may be a bonding bump.

According to the above-mentioned invention, when an electric element is connected to the substrate, the bonding bump serves as a cushion. As a result, it is possible to lessen damage to the electric element due to the flip chip connection.

Additionally, there is provided according to another aspect of the present invention a semiconductor device, comprising: a terminal having a pad being provided on an active surface of an electric element, a metal post being connected to the pad, and a projection electrode being provided on the metal post, wherein the terminal is used for flip chip mounting.

In the above-mentioned semiconductor device, the active surface of the electric element may have another electric element thereon.

Additionally, there is provided according to another aspect of the present invention a semiconductor device, comprising: a terminal having a pad being provided on a substrate, a metal post being connected to the pad, and a projection electrode being provided on the metal post, wherein the terminal is used for flip chip mounting.

According to the above-mentioned inventions, it is possible to provide a semiconductor device in which the terminal is used for flip chip mounting.

Additionally, there is provided according to another aspect of the present invention a terminal forming method, comprising: a metal post forming step of forming a metal post on a pad an active surface of an electric element; and a projection electrode forming step of forming a projection electrode on the metal post.

Additionally, there is provided according to another aspect of the present invention a terminal forming method, comprising: a metal post forming step of forming a metal post on a pad on a substrate; and a projection electrode forming step of forming a projection electrode on the metal post.

According to the above-mentioned inventions, it is possible to lessen damage to the electric element due to vibration caused by an ultrasonic wave and suppress misalignment and height unevenness of individual terminals.

Additionally, there is provided according to another aspect of the present invention a flip chip semiconductor device manufacturing method, comprising; a terminal forming step including a metal post forming step of forming a metal post on a pad on an active surface of an electric element, and a projection electrode forming step of forming a projection electrode on the metal post.

Additionally, there is provided according to another aspect of the present invention a flip chip semiconductor device manufacturing method, comprising; a terminal forming step including a metal post forming step of forming a metal post on a pad on a substrate, and a projection electrode forming step of forming a projection electrode on the metal post.

According to the above-mentioned inventions, it is possible to lessen damage to the electric element due to vibration caused by an ultrasonic wave and suppress misalignment and height unevenness of individual terminals.

Other objects, features and advantages of the present invention will become more apparent from the following detailed description when read in conjunction with the accompanying drawings.

DETAILED DESCRIPTION OF THE PREFERRED EMBODIMENTS

In the following, embodiments of the present invention will be described with reference to the accompanying drawings.

A terminal according to the first embodiment of the present invention is used for flip chip connections wherein the terminal comprises a pad provided on an active surface of an electric element on an IC chip, a metal post provided on the pad, and a bump provided on the metal post. Here, an IC chip, a CSP, a SAW filter or the like is used as the electric element.

Figure 4A:
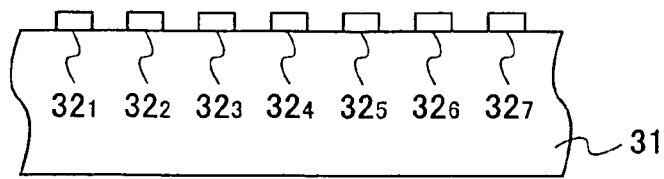
FIGS. 4A through 4D are diagrams for explaining an implementation procedure of a flip chip semiconductor device according to a first embodiment of the present invention.

A description will now be given, with reference to FIGS. 4A through 4D, of an implementation procedure of a flip chip semiconductor device according to the first embodiment of the present invention. First, a semiconductor wafer as shown in FIG. 4A is prepared wherein electrodes (pads) $32_1$ through $32_7$ are formed on an active surface of a silicon wafer 31. Here, the electrodes $32_1$ through $32_7$ are formed of aluminum, copper and the like. Each of the electrodes $32_1$ through $32_7$ has a height of about 1 μm through 2 μm.

Figure 4B:
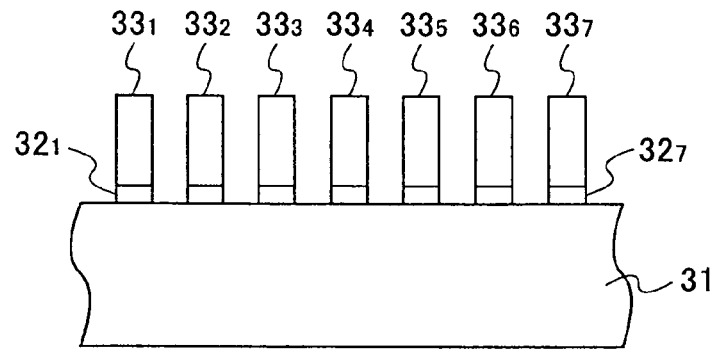

Then, as is shown in FIG. 4B, metal posts $33_1$ through $33_7$ are provided on the electrodes $32_1$ through $32_7$, respectively, through plating. Here, the metal posts $33_1$ through $33_7$ are formed of a metal such as copper, nickel, gold, platinum, palladium and an alloy of platinum and palladium. Each of the metal posts $33_1$ through $33_7$ has a height of about 100 μm.

Figure 4C:

Subsequently, as is shown in FIG. 4C, bonding bumps (projection electrodes) $34_1$ through $34_7$ are provided on the metal posts $33_1$ through $33_7$, respectively, and then an IC chip 30 is mounted to the semiconductor wafer. The IC chip 30 has a height of about 50 μm. Here, although the IC chip 30 is mounted according to a flip chip bonding method, it should be noted that bonding bumps are omitted in FIG. 4C.

Figure 1A:
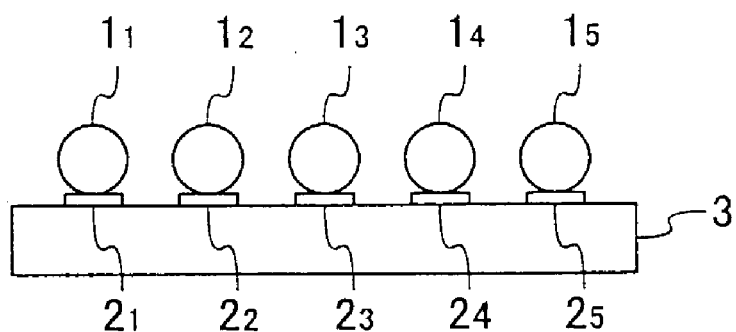
FIGS. 1A through 1C are diagrams illustrating an outline of a conventional flip chip bonding method.
Figure 1B:
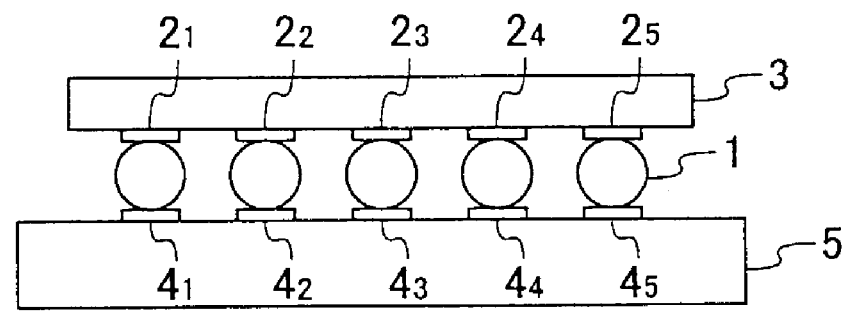
Figure 1C:
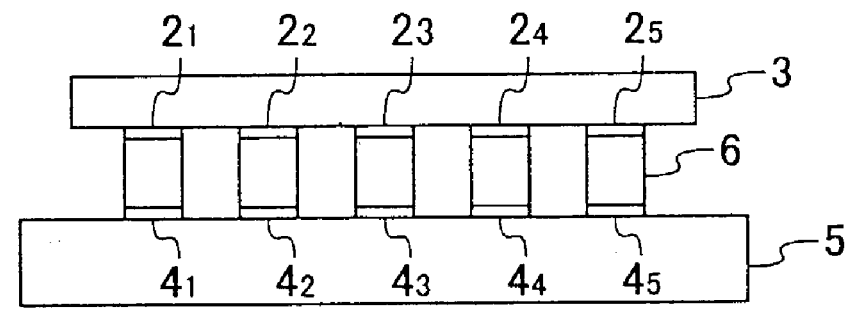
Figure 2:
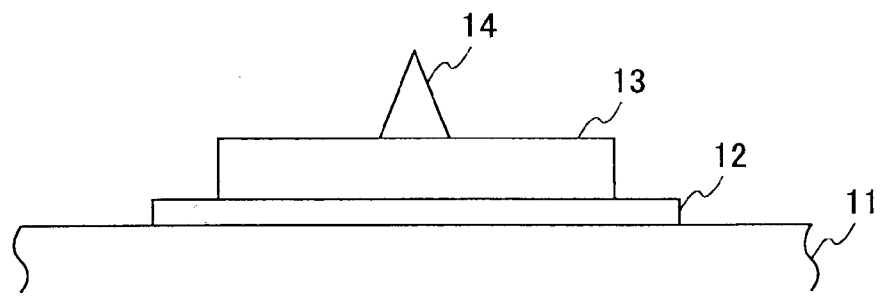
FIG. 2 is a diagram illustrating the structure of a bonding bump formed according to a conventional bonding bump method.
Figure 3A:
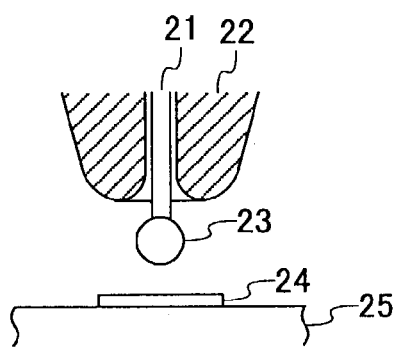
FIGS. 3A through 3D are diagrams for explaining a bonding bump formation process according to the conventional bonding bump method.
Figure 3B:
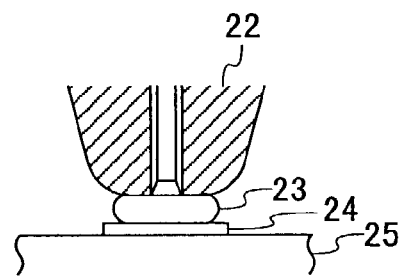
Figure 3C:
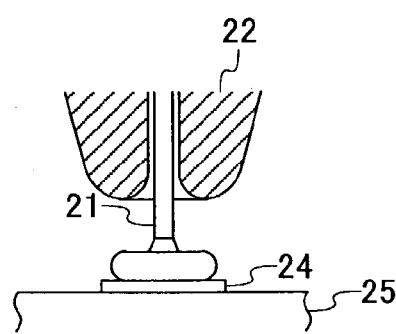
Figure 3D:
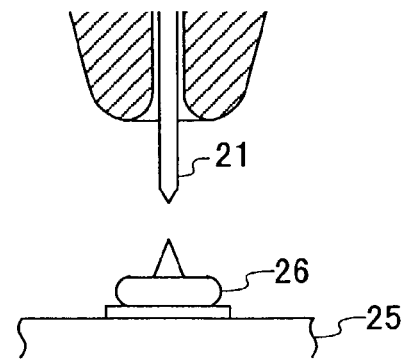

The bonding bumps $34_1$ through $34_7$ are formed according to the above-mentioned bonding bump forming method in FIG. 3. Each of the bonding bumps $34_1$ through $34_7$ collectively refers to both a neck part (such as, for example, FIG. 2, element 14) and a bump part (such as, for example, FIG. 2, element 13). Each of the bonding bumps $34_1$ through $34_7$ has a height of about 50 μm through 60 μm.

The total height of the electrodes 32, the metal posts 33 and the bonding bumps 34 comprising the terminals reaches about 150 μm through 160 μm, which is sufficiently greater than that of the IC chip 30. Thus, it is possible to flip chip mount on a substrate using the terminals according to the first embodiment. Also, the height of the metal posts 33 may be adjusted in accordance with the height of the IC chip 30.

Figure 4D:
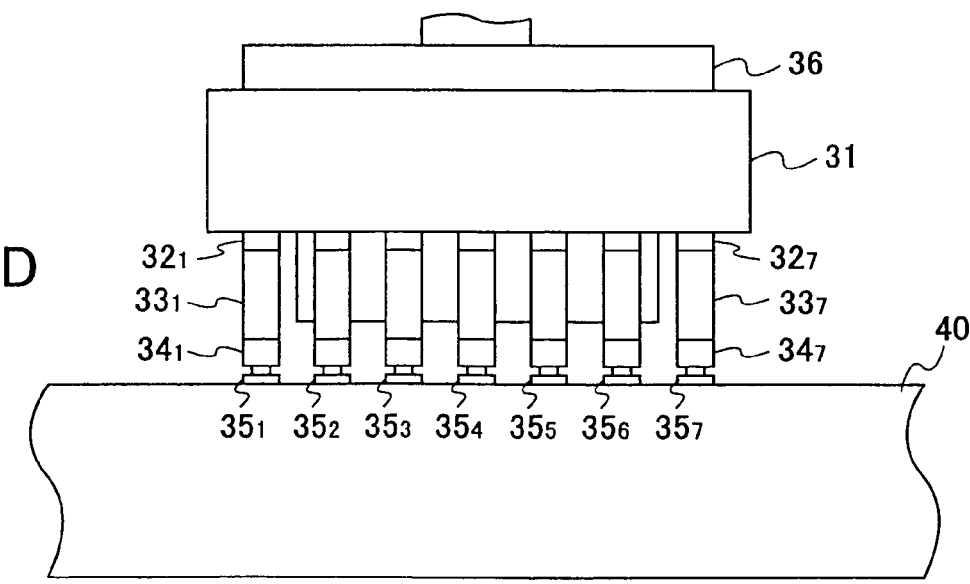

Then, the semiconductor wafer is diced into individual electric elements. After that, as is shown in FIG. 4D, an electric element 31 having the metal posts 33 is mounted face-down on a substrate 40 by using an ultrasonic wave bonding head 36 according to a flip chip mounting method. Terminals $35_1$ through $35_7$ on the substrate 40 are aligned with the bonding bumps $34_1$ through $34_7$ on the electric element 31, respectively, for a flip chip connection.

In the above-mentioned implementing procedure of the flip chip semiconductor device according to the embodiment, the IC chip (child chip) 30 is mounted to the semiconductor wafer after the bonding bump formation. However, the IC chip 30 may be mounted to the individual electric elements 31 after dicing of the semiconductor wafer.

As mentioned above, the metal posts 33 are provided on the active surface of the electric element 31, and the electric element 31 is flip chip connected to the substrate 40 through projection electrodes 34 on the metal posts 33. As a result, when the height of the metal posts 33 is adjusted in accordance with the height of the IC chip 30 to be provided on the electric element 31, it is possible to flip chip mount the electric element 31 having the IC chip 30 even if the height of the IC chip 31 is variable.

In addition, since bonding bumps are formed only once according to the bonding bump forming method of the present invention, it is possible to lessen damage to the electric element 31 due to an ultrasonic wave compared to the conventional multi-layer bonding bump forming method for forming more than two layers.

In addition, it is possible to avoid misalignment of the center of individual layers and secure accurate positions of the bonding bumps 34 at connection areas in comparison with the conventional multi-layer bonding bump forming method for forming more than two layers.

In addition, it is possible to only rarely cause the height unevenness in comparison with the conventional multi-layer bonding bump forming method for forming more than two layers.

In addition, since bonding bumps are provided on metal posts, unlike the conventional case where an electric element and a substrate are flip chip mounted via only the metal posts, the bonding bumps serve as cushions of the connection. As a result, it is possible to lessen damage caused by the connection.

A description will now be given, with reference to FIG. 5, of an implementation procedure of a flip chip semiconductor device according to the second embodiment of the present invention.

In the implementation procedure according to the first embodiment, the metal posts 33 are provided on the active surface of the electric element 31. As is shown in FIG. 5, in the implementation procedure of a flip chip semiconductor device according to the second embodiment, metal posts are provided on a substrate.

Figure 5:
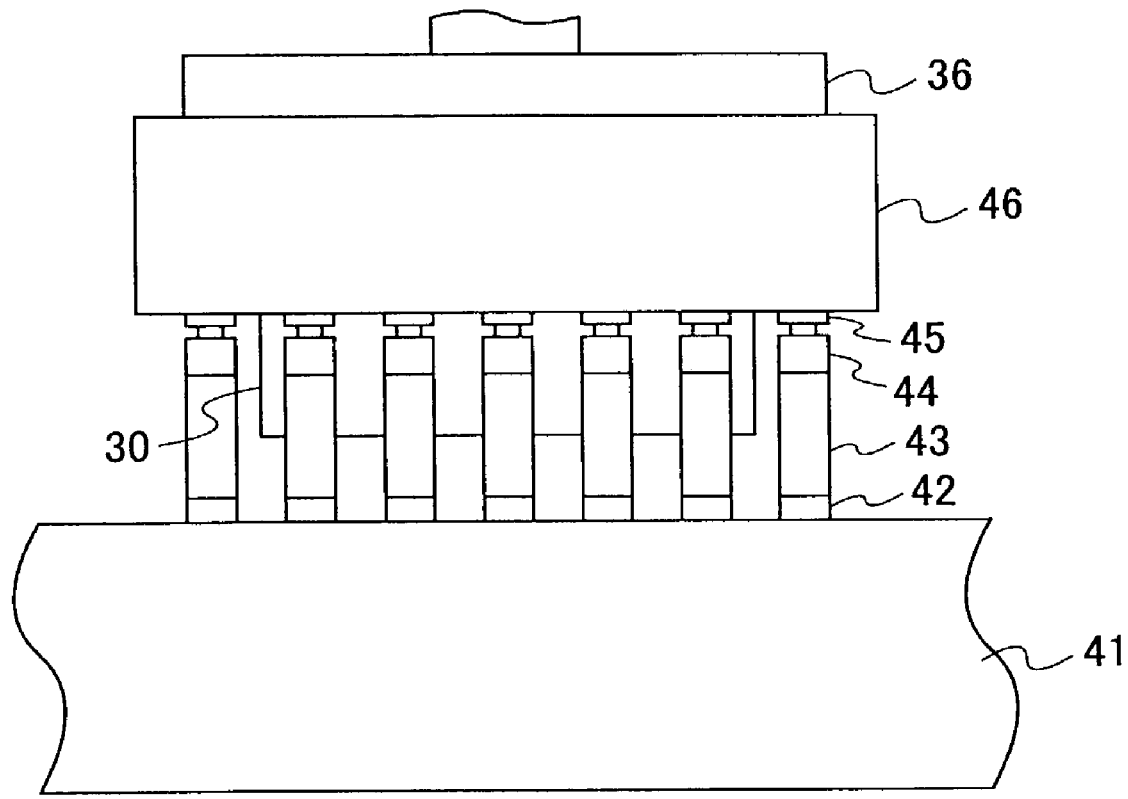
FIG. 5 is a diagram for explaining an implementation procedure of a flip chip semiconductor device according to a second embodiment of the present invention.

In FIG. 5, metal posts 43 and bonding bumps 44 are formed on electrodes 42 on a substrate 41 like FIGS. 4A through 4C. In the flip chip mounting method, an electric element 46 is mounted face-down on the substrate 41 by using an ultrasonic wave bonding head 36.

Even in this case, it is possible to lessen damage due to vibration caused by an ultrasonic wave and overcome the position problem and the height unevenness problem as mentioned above.

A description will now be given, with reference to FIGS. 6A and 6B and FIG. 7, of some variations of the above-mentioned implementation procedure of a semiconductor device.

If a bonding bump is primarily formed of gold, it is necessary to provide gold, nickel or a gold coating on a surface of a metal post where the metal post is in contact with the bonding bump.

Figure 6A:
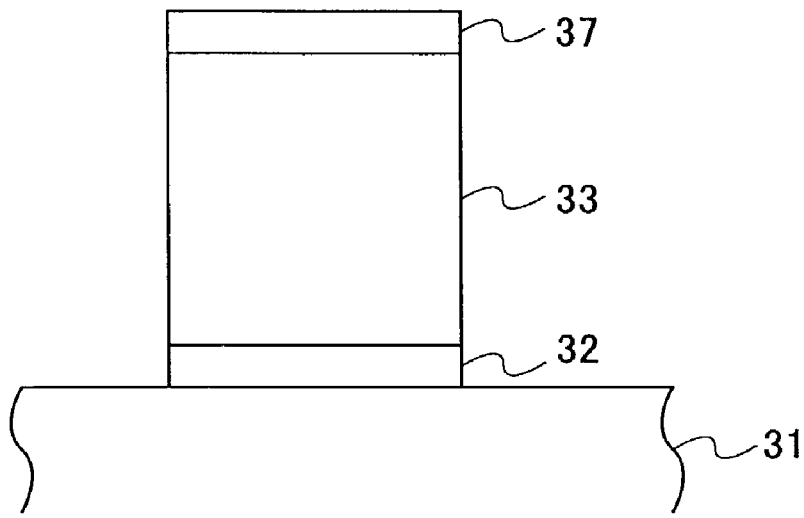
FIGS. 6A and 6B are diagrams for explaining variations of a terminal according to the embodiments of the present invention.
Figure 6B:
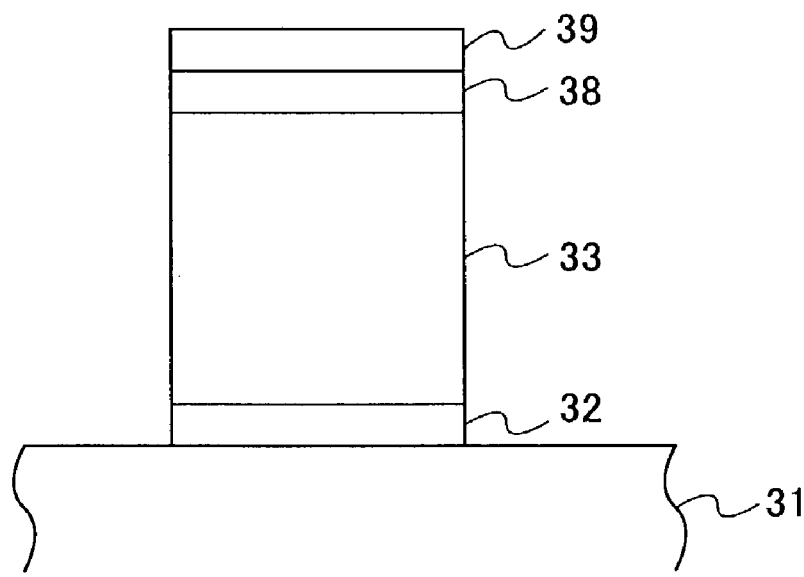
Figure 7:
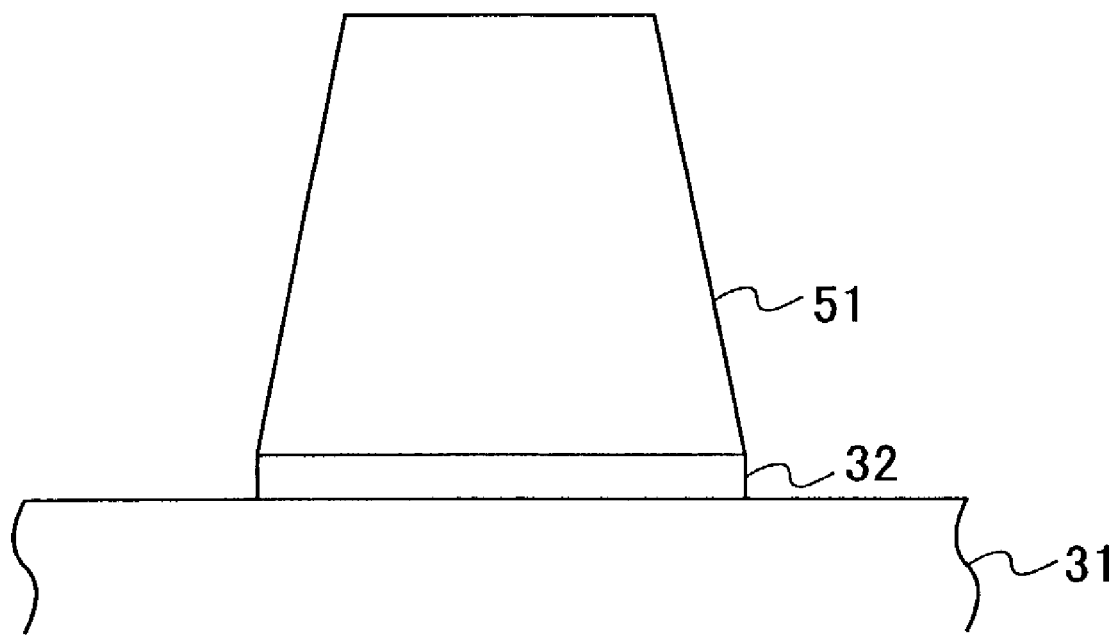
FIG. 7 is a diagram for explaining another variation of a terminal according to the embodiments of the present invention.

FIG. 6A shows a case where a gold coating 37 is provided on a metal post 33 on an electrode 32 of an electric element 31. FIG. 6B shows a case where a nickel coating 38 and a gold coating 39 are provided on the metal post 33 on the electrode 32 of the electric element 31.

Here, the metal post 33 may have a trapezoidal shape. For instance, FIG. 7 shows a case where a trapezoidal metal post 51 is provided on the electrode 32 of the electric element 31. When such a trapezoidal metal post 51 is provided, it is possible to resist vibration due to bonding bump formation and flip chip mounting by using an ultrasonic wave.

Here, nickel and other various metals may be used as the metal post. However, if the metal post is formed of copper, it is possible to realize a low electric-resistance terminal that has high heat radiation efficiency. In this case, in particular, when a pad on an active surface is formed of copper, the pad has an affinity for the metal post.

In the above-mentioned embodiments, a metal post is provided on an electrode on an active surface of an electric element including an IC chip. However, it is not necessary to mount the metal post directly to the electrode. It is sufficient that the metal post is connected to the electrode.

Also, if a wire is provided on the active surface of the electric element so as to be connected to the electrode (pad) of the electric element, the metal post may be formed on an electrode of the wire.

Also, although an IC chip is mounted on an active surface of an electric element in the above-mentioned implementation procedures, a chip capacitor, a chip resistor or the like may be mounted to the electric element instead of (or in addition to) the IC chip.

The present invention is not limited to the specifically disclosed embodiments, and variations and modifications may be made without departing from the scope of the present invention.

The present application is based on Japanese priority application No. 2002-161840 filed on Jun. 3, 2002, the entire contents of which are hereby incorporated by reference.

What is claimed is:

1. A semiconductor device on a substrate, comprising:
a first semiconductor element including a semiconductor connection pad and a terminal pad on an active surface thereof;
a second semiconductor element flip-chip mounted to the first semiconductor element via the semiconductor connection pad of the first semiconductor element;
a terminal flip-chip connecting the first semiconductor element to the substrate, the terminal including a metal post and a projection electrode coupled on the metal post, the projection electrode configured as a bonding bump mainly formed of gold;
wherein the terminal is connected to the first semiconductor element by coupling the metal post of the terminal to the terminal pad of the first semiconductor element, wherein the terminal is flip-chip connected to the substrate by coupling a substrate pad provided on the substrate to the projection electrode on the metal post, and wherein a total height of the metal post and the projection electrode is greater than a height of the second semiconductor element.

2. The semiconductor device as claimed in claim 1, wherein said projection electrode is primarily formed of gold, and one of gold, nickel and a gold coating is provided on a surface of said metal post where said metal post is in contact with said projection electrode.

3. The semiconductor device as claimed in claim 1, wherein said metal post is formed of copper.

4. A semiconductor device on a substrate, comprising:
a first semiconductor element including a semiconductor connection pad and a flip-chip connection pad on an active surface thereof;
a second semiconductor element flip-chip mounted to the first semiconductor element via the semiconductor connection pad of the first semiconductor element;
a terminal flip-chip connecting the first semiconductor element to the substrate, the terminal including a metal post and a projection electrode coupled on the metal post the projection electrode configured as a bonding bump mainly formed of gold,
wherein the terminal is flip-chip connected to the first semiconductor element by coupling the projection electrode of the terminal to the flip-chip connection pad of the first semiconductor element, wherein the terminal is connected to the substrate by coupling a substrate pad provided on the substrate to the metal post on the projection electrode, and wherein a total height of the metal post and the projection electrode is greater than a height of the second semiconductor element.

5. The semiconductor device as claimed in claim 4, wherein said projection electrode is primarily formed of gold, and one of gold, nickel and a gold coating is provided on a surface of said metal post where said metal post is in contact with said projection electrode.

6. The semiconductor device as claimed in claim 4, wherein said metal post is formed of copper.

* * * * *